United States Patent
Chen

(10) Patent No.: US 6,713,219 B2
(45) Date of Patent: Mar. 30, 2004

(54) SUBSTRATE EXPOSURE APPARATUS AND METHOD

(75) Inventor: Kuo-Tso Chen, Hsinchu (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/064,208

(22) Filed: Jun. 21, 2002

(65) Prior Publication Data

US 2003/0108806 A1 Jun. 12, 2003

(30) Foreign Application Priority Data

Dec. 10, 2001 (TW) .......................... 90130498 A

(51) Int. Cl.⁷ ................................. G03F 9/00
(52) U.S. Cl. ............................ 430/30; 430/5
(58) Field of Search ....................... 430/5, 30

(56) References Cited

U.S. PATENT DOCUMENTS

| 6,291,110 | B1 | * | 9/2001 | Cooper et al. ............... 430/5 |
| 6,544,698 | B1 | * | 4/2003 | Fries ........................... 430/22 |
| 2002/0192569 | A1 | * | 12/2002 | Ulland et al. ............... 430/5 |
| 2003/0084422 | A1 | * | 5/2003 | Chan ........................... 430/5 |

* cited by examiner

*Primary Examiner*—Christopher G. Young
(74) *Attorney, Agent, or Firm*—Jiang Chyun IP Office

(57) ABSTRACT

A substrate exposure apparatus, having a line light source and a control system. The line light source has several point light sources. The control system converts the pattern into a timing signal to control the light status and dark status of each point light source. The control system also controls a scan light source to radiate the photoresist on the substrate, so that the photoresist is exposed. Further, in a substrate exposure method, multiple point light sources are arranged as at least one line light source to scan the photoresist once or several times to obtain a better resolution of the pattern transferred to the photoresist.

25 Claims, 4 Drawing Sheets

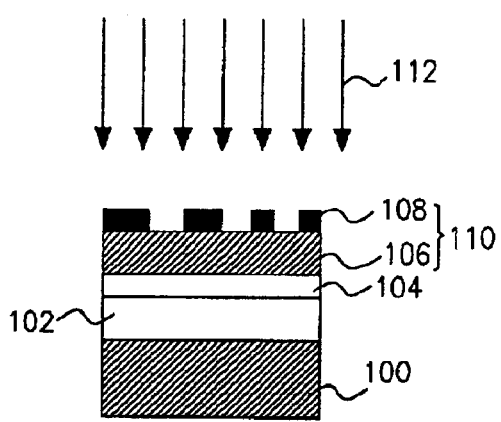
FIG. (PRIOR ART)
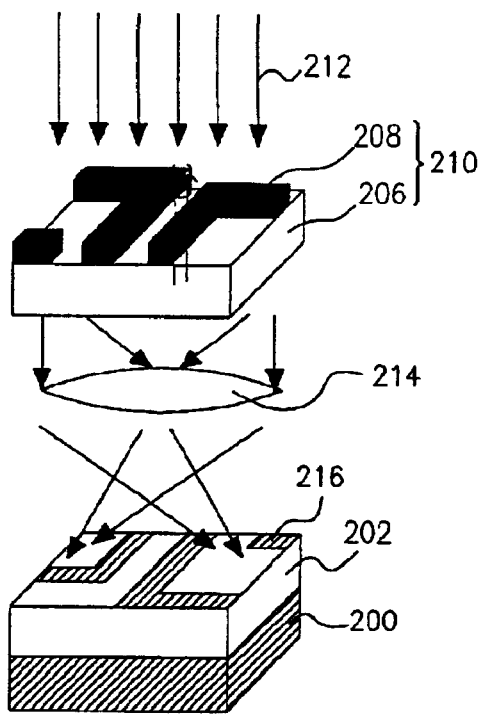
FIG. 2 (PRIOR ART)

SUBSTRATE EXPOSURE APPARATUS AND METHOD

CROSS REFERENCE TO RELATED APPLICATIONS

This application claims the priority benefit of Taiwan application serial no. 90130498, filed Dec. 10, 2001.

BACKGROUND OF THE INVENTION

1. Field of the Invention

The invention relates in general to a substrate exposure apparatus and method, and more particularly, to a substrate exposure apparatus and method that does not require a photomask for transferring a pattern to the photoresist.

2. Description of the Related Art

Photolithography process is one of the crucial steps in the print circuit board, the substrate and the semiconductor fabrication process. In wafer fabrication, the patterned and doped regions for each thin film layer are determined by photolithography process. Additionally, the formation of metal film patterns in the print circuit board and the substrate are determined by the photolithographic process. For each one, the photomask must be well prepared. In the photolithographic process, after some preparation procedures, the photomask is coated on the substrate, and then a soft baking and a hard baking processes are further performed. After the photoresist on the wafer is cured, the steps of exposure and development are performed to transfer the pattern of the photomask to the photoresist.

Referring to FIG. 1, a conventional photolithography process that uses a contact mode photomask to transfer the pattern to the photoresist is schematically shown. A substrate 100, on which circuit, dielectric layer, dielectric pattern or conductive layer may have been formed, is provided. A photoresist 102 is formed on the substrate 100. A photomask 110 is disposed on the photoresist 102. To protect the surface of the photomask 110, a protect film 104 is placed between and separates the photomask 110 and the photoresist 102. The protect film 104 is in contact with both the surface of the photomask 110 and the photoresist 102. By radiation of a light source 112, an exposure step is performed on the photoresist 102, so that the pattern of the photomask 110 is transferred to the photoresist 102.

The conventional contact mode photomask 110 includes formation of a patterned blocking layer 108 on a surface of a transparent substrate 106. To protect the photomask 110, the protect film 104 sandwiched between the photomask substrate 106 and the photoresist 102 is in contact with both surfaces of the photomask substrate 106 and the photoresist 102. The patterned blocking layer 108 of the photomask 110 blocks the light source 112 to determine the pattern on the photoresist 102 to be radiated.

Referring to FIG. 2, a conventional photolithography process using a non-contact mode photomask to transfer a pattern to a photoresist is schematically shown. A substrate 200 on which a photoresist 202 is formed is provided. Circuits, dielectric layers, dielectric patterns or conductive layers may have been formed on the substrate 200. A photomask 210 is located above the photoresist 202. A lens set 214 is disposed between the photomask 210 and the photoresist 202. By radiation of a light source 212, the photoresist 202 is exposed, and the pattern of the blocking layer 208 on the photomask 210 is transferred as the pattern 216 on the photoresist 202.

The conventional non-contact mode photomask is constructed by forming the patterned blocking layer 208 on a transparent substrate 206. The patterned blocking layer 208 on the transparent substrate 206 blocks the light source to determine the pattern of the photoresist 202 to be radiated. In a non-contact mode, the pattern of the photomask 210 is transferred to the photoresist 202 by the lens set 214. The fabrication of the conventional photomask is very time consuming and costly. The photomask has to be kept in an appropriate environment, and the maintenance cost is also high.

In addition, the pattern of the photomask cannot be modified. When the circuit design of the wafer or printed circuit board requires a modification, a new photomask has to be fabricated.

SUMMARY OF THE INVENTION

The present invention provides a substrate exposure apparatus and method that does not require a photomask. The fabrication cost and maintenance cost of a photomask in the photolithography process are thus saved.

The substrate exposure apparatus provided by the present invention comprises a scan light source and a control system. The scan light source is located over the photoresist to be exposed on the substrate. The control system controls the scan light source or the substrate to shift along a scan path, and converts the pattern to be formed on the photoresist into a timing signal, so as to control the light and dark status of the scan light source at different times.

In the above substrate exposure apparatus, the scan light comprises multiple point light sources. The point light sources are arranged in a single file such as a line light source. Alternatively, the point light sources can be arranged in multiple files such as multiple line light sources. The line light sources are parallel to each other. Along the aligning direction of each line light source, there is a specific position shift for each of the line light sources, so that the point light sources in one line light source are staggered with the point light sources in another line light source. As a result, the exposure resolution is enhanced. The above point light sources include light emitting diodes and laser diodes.

In the substrate exposure apparatus of the present invention, the light of the scan light source is adjusted by a lens set to radiate the photoresist for exposure.

In the present invention, a substrate exposure method is provided. The substrate exposure method uses a scan light source and a control system to perform exposure on a photoresist on a substrate. The scan light source is located above the photoresist. The control system controls the scan light source or the substrate to shift along a scan path. The pattern to be transferred to the photoresist is converted into a timing signal to control the light and dark status of the scan light source, so as to perform exposure on the photoresist.

In the above substrate exposure method, the scan path of the scan light source is vertical to the aligning direction of the point light sources.

In the above substrate exposure method, the scan path of the scan light does not have to be vertical to the aligning direction of the point light sources.

Both the foregoing general description and the following detailed description are exemplary and explanatory only and are not restrictive of the invention, as claimed.

BRIEF DESCRIPTION OF DRAWINGS

FIG. 1 is a schematic drawing of a conventional photolithography process to transfer a pattern from a contact mode photomask to a photoresist;

FIG. 2 is a schematic drawing of a conventional photolithography process to transfer a pattern from a non-contact mode photomask to a photoresist;

DETAILED DESCRIPTION

Figures 3, 4:
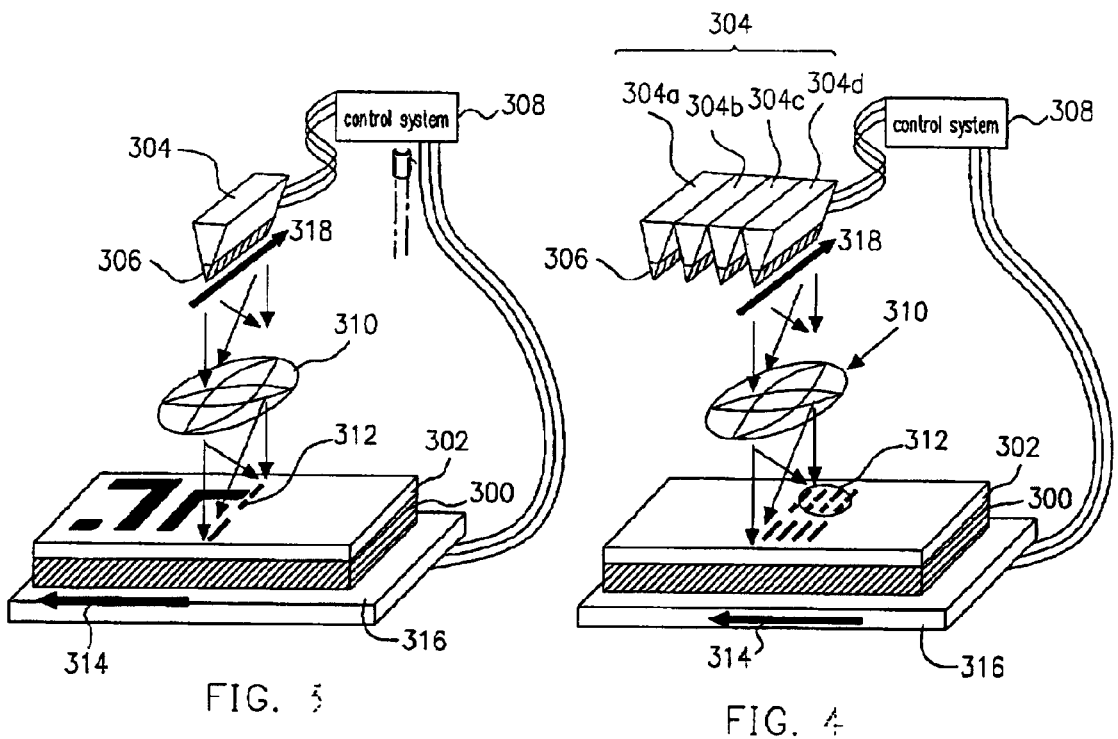
FIG. 3 is a schematic drawing for forming a pattern on a photoresist using point light sources aligned into a single line in one embodiment of the present invention.
FIG. 4 is a schematic drawing for forming a pattern on a photoresist using point light sources aligned into multiple lines in one embodiment of the present invention.

Referring to FIG. 3, a schematic drawing for forming a pattern on a photoresist using point light sources arranged in a single line is shown. Before performing the exposure process, a substrate 300 with a photoresist 302 formed thereon is provided. Circuits, dielectric layers, dielectric patterns or conductive layers may have been formed on the substrate 300. The substrate 300 is disposed in a chaise 316. The substrate 300 includes a wafer, a printed circuit board or various types of package substrates. The substrate exposure apparatus comprises a scan light source 304 and a control system 308. The scan light source 304 comprises multiple point light sources 306 arranged in a single file such as a line light source 304 along an aligning direction 318. The point light sources 306 comprise light emitting diodes or laser diodes. The control system 308 controls the chaise 316 that carries the substrate 300 to move along the substrate shifting direction 314. By the control system 308, a pattern 312 to be transferred to the photoresist 302 is converted into a timing signal which controls the light and dark status of the scan light source 304 at different times for exposing the photoresist 302. In addition, a lens set 304 is located between the scan light source 304 and the substrate 300. The lens set 310 can adjust the light emitted from the scan light source 304 before radiating the photoresist 302.

Further referring to FIG. 3, the substrate 300 in the chaise 316 is shifted along the substrate shifting direction 314. The control system 308 decodes the pattern to be transferred to the photoresist 302 into a one-dimensional light spot-to-time signal. Such one-dimensional timing signal controls the light and dark status for each point source 306 of the scan light source 304. As the substrate 300 is shifted along the substrate shifting direction 314, a relative motion between the substrate 300 and the scan light source 304 is produced. Therefore, the light and dark status of the scan light source 304 at different times determines whether various positions of the photoresist 302 are exposed or not. After the scan of the scan light source 304, the two-dimensional pattern 312 is transferred to the photoresist 302.

Referring to FIG. 4, a schematic drawing of forming a pattern on the photoresist using multiple lines of point light sources is shown. Before performing the exposure process, the substrate 300 with a photoresist 302 formed thereon is provided. Circuits, dielectric layers, dielectric patterns or conductive layers may have been formed on the substrate 300. The substrate 300 is disposed in a chaise 316. The substrate exposure apparatus comprises a scan light source 304 and a control system 308. The scan light source 304 comprises multiple point light sources 306 arranged in multiple parallel line light sources 304a, 304b, 304c, 304d with an aligning direction 318. A position shift S along the aligning direction 318 for the line light sources 304a, 304b, 304c and 304d allows the point sources 306 in each of the line light sources 304a, 304b, 304c and 304d to be staggered, so as to enhance the exposure resolution.

The substrate 300 carried by the chaise 316 is shifted along the substrate shifting direction 314. The control system 308 converts the pattern to be transferred to the photoresist 302 into a timing signal to control the light and dark status of the scan light source 304 for exposing the photoresist 302. A lens set 310 is located between the scan light source and the substrate 300 to adjust the light emitted from the scan light source 304 (for example, minifying, magnifying, focusing and defocusing the pattern) before radiating the photoresist 302.

Further referring to FIG. 4, the substrate 300 in the chaise 316 is shifted along the substrate shifting direction 314. The control system 308 decodes the pattern to be transferred to the photoresist 302 into a one-dimensional light spot-to-time signal. Such one-dimensional timing signal controls the light and dark status for each point source 306 of the scan light source 304. As the substrate 300 is shifted along the substrate shifting direction 314, a relative motion between the substrate 300 and the scan light source 304 results. Therefore, the light and dark status of the point sources 306 in each line light source 304a, 304b, 304c and 304d at different times determines whether various positions of the photoresist 302 are exposed or not. After the scan of the scan light source 304, the two-dimensional pattern 312 is transferred to the photoresist 302.

Figure 5:
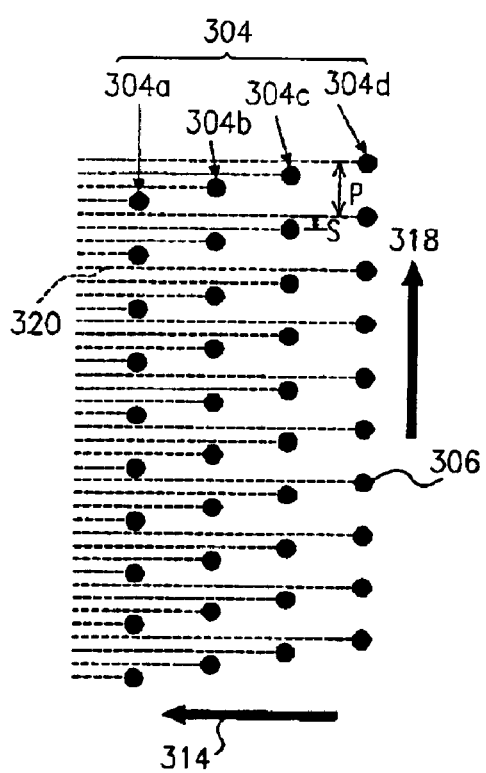
FIG. 5 is a schematic drawing of a scan path on the photoresist using point sources aligned into multiple lines in one embodiment of the invention.

Referring to FIG. 5, the scan path on the photoresist using multiple lines of point light sources is schematically shown. It is clear from FIG. 5 that the point light sources 306 are arranged into line light sources 304a, 304b, 304c, 304d. A position shift S along the direction 318 for the line light sources 304a and 304b, is 1/n of the distance P between the neighboring point light sources 306. Similarly, the position shift S exists along the direction 318 for the line light sources 304b and 304c, and 304c and 304d.

By moving the substrate 300 along the substrate shifting direction 314, the line light sources 304a, 304b, 304c and 304d perform exposure on the photoresist 302 along the scan direction 320. The space between each scan path 320 is the shift position 5. Using the line light sources 304a, 304b, 304c and 304d as an example, the resolution of the scan light source 304 along the direction 318 is enhanced four times compared to the single line light source.

Figure 6:
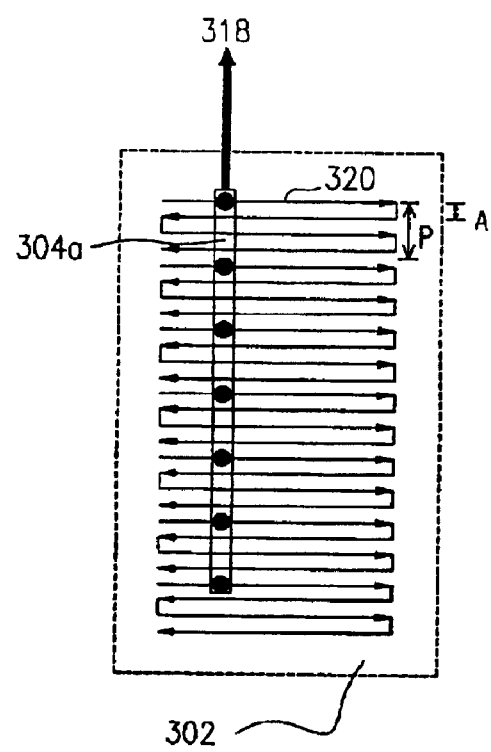
FIG. 6 is a schematic drawing of multiple scan paths for performing multiple scans on the photoresist using point light sources aligned into a signal line in one embodiment of the invention.

Referring to FIG. 6, the scan path for performing multiple scans on the photoresist using a single line of point light sources is schematically shown. In FIG. 4, the point light sources 306 are arranged into multiple line light sources 304a, 304b, 304c and 304d to improve the resolution in the direction 318. In addition to the method of changing the arrangement of point light sources, a better resolution can also be obtained by changing the scan method of the scan light source 304. It is clearly seen in FIG. 6 that the point light sources 306 are arranged into a single line light source 304 aligned with the direction 318. The aligning direction 318 of the single line light source 304 is vertical to the scan path 320. In addition, the line light source 304 scans the photoresist 302 along the scan path 320 multiple times. The path for each scan is spaced from the previous scan with a distance A, where A is equal to 1/n of the pitch P of the point sources 306, and n is a natural number.

Figure 7:
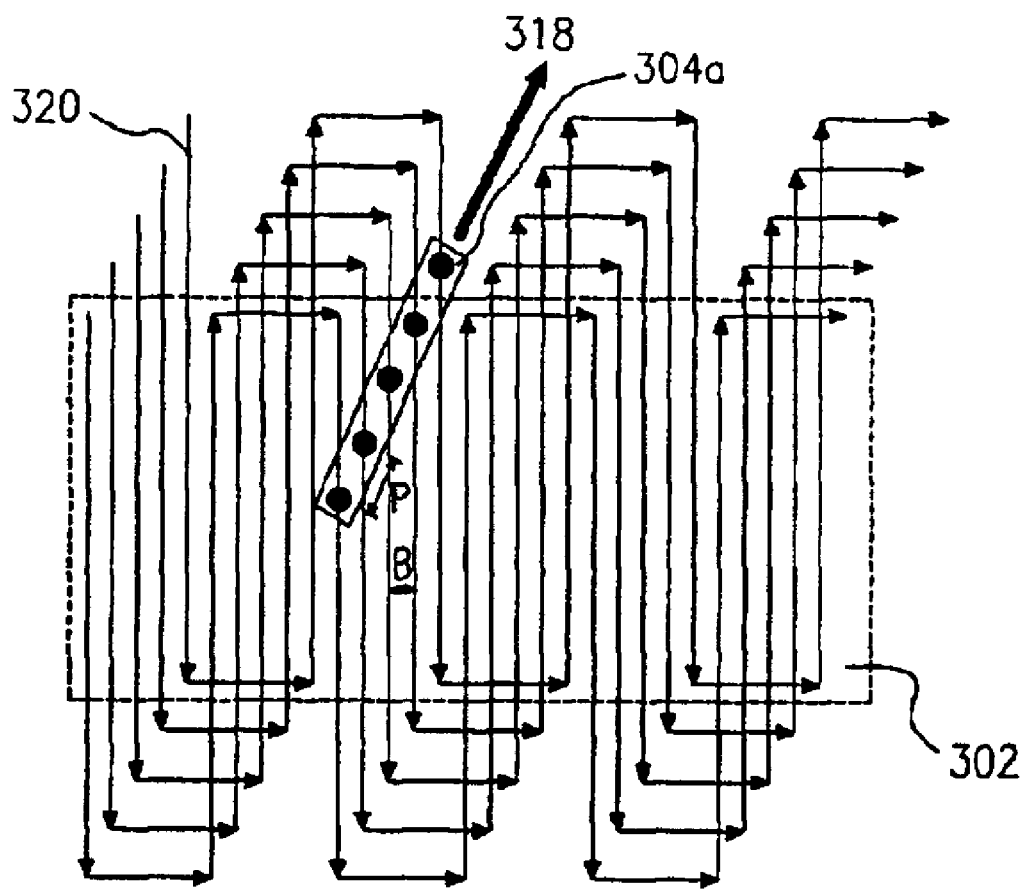
FIG. 7 is a schematic drawing of multiple scan paths for performing multiple scans on the photoresist using point light sources aligned into a signal line in another embodiment of the invention.

Referring to FIG. 7, a scan path for scanning the photoresist several times using another single line of point sources is schematically shown. As shown in FIG. 7, though the photoresist 302 is exposed by multiple scans, the angle between the scan path 320 and the aligning direction 318 of the point sources 306 is not equal to 90°. Since such angle is not 90°, the distance between the neighboring scan paths B is smaller than the pitch P of the point light sources 306. Thus, the scan resolution is also improved.

In FIGS. 6 and 7, by multiple scans and controlling the angle between the scan path and the aligning direction of the point light sources unequal to 90°, the resolution is enhanced. It is appreciated that people of ordinary skill in the art may properly combine the above two methods to obtain a further improved resolution.

In addition, in the above FIGS. 3 to 7, the shift of the substrate 300 is accompanied with the light and dark status control of the scan light source 304 at different times to perform exposure on the photoresist 302. However, the relative motion for the photoresist 302 and the scan light source 304 can also be achieved by the shift of the scan light source, the lens set 310, or even by the movement or rotation of some mirror or lens in the lens 310.

According to the above, the present invention includes at least the following advantages.

1. The substrate exposure apparatus and method directly transfers the pattern to the photoresist by scan, so that the time for fabricating the photomask is saved.

2. Various patterns can be transferred to the photoresist using the substrate exposure apparatus and method provided by the present invention, while the fabrication of photomasks corresponding to different patterns is not required. The fabrication cost is thus greatly reduced.

3. The pattern is transferred to the photoresist by scan, so that it is even easier for automatic mass production of integrated circuits.

4. While fabricating the products, the circuit design can be modified in a real time, so that the development time is reduced, and versatile customized designs with small quantity become possible.

5. The relative position of the light sources and the lens set is fixed, so that the aligning position difference is fixed (not altered by change of photomask), and the position correction is easier.

6. The cost maintenance and preservation of photomasks can be eliminated.

Other embodiments of the invention will appear to those skilled in the art from consideration of the specification and practice of the invention disclosed herein. It is understood that the specification and examples are to be considered as exemplary only, with a true scope and spirit of the invention being indicated by the following claims.

What is claimed is:

1. A substrate exposure method, to transfer a pattern to a photoresist on a surface of a substrate, comprising:

providing a scan light source at a distance spaced from a surface of the photoresist on the substrate with a distance, wherein the scan light source comprises a plurality of point light sources;

providing a control system, to convert the pattern into a timing signal to control light and dark status of each of the point light sources at different times, and to provide a scan function, so that the scan light source performs at least one scan along a scan path to expose the photoresist.

2. The substrate exposure method according to claim 1, wherein the substrate includes a printed circuit board.

3. The substrate exposure apparatus according to claim 1, wherein the substrate includes a wafer.

4. The substrate exposure method according to claim 1, wherein the substrate includes various types of package substrates.

5. The substrate exposure method according to claim 1, wherein the scan function is achieved by shifting the scan light source.

6. The substrate exposure method according to claim 1, wherein the scan function is achieved by shifting the substrate.

7. The substrate exposure method according to claim 1, wherein the substrate is earned by a chaise.

8. The substrate exposure method according to claim 7, wherein the scan function is achieved by shifting the chaise.

9. The substrate exposure method according to claim 1, wherein a lens set is disposed along the optical path between the scan light source and the substrate.

10. The substrate exposure method according to claim 9, wherein the scan function is achieved by rotating at least one component in the lens set.

11. The substrate exposure method according to claim 9, wherein the scan function is achieved by shifting at least one component in the lens set.

12. The substrate exposure method according to claim 1, wherein the point light sources include either light emitting diodes or laser diodes.

13. The substrate exposure method according to claim 1, wherein the point light sources are arranged into at least one line light source with an axis vertical to a scan direction, and at least one scan is performed.

14. A substrate exposure method, to transfer a pattern to a photoresist on a surface of a substrate, comprising:

providing a scan light source at a distance spaced from a surface of the photoresist on the substrate with a distance, wherein the scan light source comprises a plurality of point light sources; and providing a control system, to convert the pattern into a timing signal to control light and dark status of each of the point light sources at different times, and to provide a scan function, so that the scan light source performs at least one scan to expose the photoresist, wherein the point light sources are arranged with at least one line light source having an axis not vertical to a scan direction.

15. The substrate exposure method according to claim 14, wherein the substrate includes a printed circuit board.

16. The substrate exposure apparatus according to claim 14, wherein the substrate includes a wafer.

17. The substrate exposure method according to claim 14, wherein the substrate includes various types of package substrates.

18. The substrate exposure method according to claim 14, wherein the scan function is achieved by shifting the scan light source.

19. The substrate exposure method according to claim 14, wherein the scan function is achieved by shifting the substrate.

20. The substrate exposure method according to claim 14, wherein the substrate is carried by a chaise.

21. The substrate exposure method according to claim 20, wherein the scan function is achieved by shifting the chaise.

22. The substrate exposure method according to claim 14, wherein a lens set is disposed along the optical path between the scan light source and the substrate.

23. The substrate exposure method according to claim 22, wherein the scan function is achieved by rotating at least one component in the lens set.

24. The substrate exposure method according to claim 22, wherein the scan function is achieved by shifting at least one component in the lens set.

25. The substrate exposure method according to claim 14, wherein the point light sources include either light emitting diodes or laser diodes.

* * * * *